(12) United States Patent
Grilo et al.

(10) Patent No.: US 8,674,863 B2
(45) Date of Patent: Mar. 18, 2014

(54) DISTRIBUTED BOOTSTRAP SWITCH

(75) Inventors: Jorge Grilo, San Diego, CA (US);
Daniel Meacham, Del Mar, CA (US);
Andrea Panigada, San Diego, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/489,651

(22) Filed: Jun. 6, 2012

(65) Prior Publication Data

US 2013/0009797 A1    Jan. 10, 2013

Related U.S. Application Data

(60) Provisional application No. 61/494,179, filed on Jun. 7, 2011.

(51) Int. Cl.
*H03M 1/00* (2006.01)

(52) U.S. Cl.
USPC ........... 341/122; 341/118; 341/120; 341/155; 341/172; 327/91; 327/94; 327/93

(58) Field of Classification Search
USPC ........... 341/122, 118, 120, 155, 172; 327/91, 327/94, 93, 589
See application file for complete search history.

(56) References Cited

U.S. PATENT DOCUMENTS

| | | | |
|---|---|---|---|
| 6,518,901 B2 * | 2/2003 | Pinna et al. | 341/122 |
| 6,525,574 B1 * | 2/2003 | Herrera | 327/94 |
| 6,693,479 B1 * | 2/2004 | Bardsley | 327/390 |
| 7,183,814 B2 * | 2/2007 | Kudo | 327/91 |
| 7,605,789 B2 * | 10/2009 | Uchino et al. | 345/92 |
| 7,710,164 B1 | 5/2010 | Sharma | 327/94 |
| 7,816,951 B1 * | 10/2010 | Lee | 327/94 |
| 8,000,117 B2 * | 8/2011 | Petricek | 363/60 |
| 8,344,759 B2 * | 1/2013 | Sundblad et al. | 327/94 |
| 2003/0042936 A1 * | 3/2003 | Herrera | 327/94 |
| 2005/0258874 A1 * | 11/2005 | Kudo | 327/91 |
| 2006/0202735 A1 | 9/2006 | Aksin et al. | 327/390 |
| 2007/0046359 A1 | 3/2007 | Zanchi et al. | 327/390 |
| 2011/0074614 A1 * | 3/2011 | Ogawa | 341/143 |

OTHER PUBLICATIONS

International PCT Search Report and Written Opinion, PCT/US2012/041259, 14 pages, mailed Aug. 30, 2012.

* cited by examiner

*Primary Examiner* — Linh Nguyen
(74) *Attorney, Agent, or Firm* — King & Spalding L.L.P.

(57) ABSTRACT

An input circuit for an analog-to-digital converter (ADC) includes at least one bootstrap circuit, including at least one first switch for connecting electrical power to a first terminal of at least one capacitor; at least one second switch for connecting a second terminal of the at least one capacitor to a signal to be sampled; at least one third switch for connecting the first terminal of the at least one capacitor to the control gate of at least one sampling network input switch; at least one fourth switch for connecting the at least one sampling network input switch to a substrate; and at least one fifth switch for connecting the second terminal of the at least one capacitor to the substrate.

10 Claims, 3 Drawing Sheets

US 8,674,863 B2

DISTRIBUTED BOOTSTRAP SWITCH

CROSS-REFERENCE TO RELATED APPLICATIONS

This invention claims priority from U.S. Provisional Patent Application Ser. No. 61/494,179, filed Jun. 7, 2011, titled "DISTRIBUTED BOOTSTRAPPED SWITCH," which is incorporated by reference herein it its entirety.

BACKGROUND OF THE INVENTION

1. Field of the Invention

The present disclosure relates to switches and, in particular, to metal oxide semiconductor (MOS) switches.

2. Description of the Related Art

Clock bootstrapping ("bootstrapping") is a technique used to enhance the linearity of Metal-Oxide-Semiconductor (MOS) switches. Through bootstrapping, the gate voltage of a MOS switch during the ON state is set at a constant value larger than the supply voltage or at a constant offset value relative to the input signal, both achieving a large gate overdrive voltage (gate source voltage minus the switch on/off threshold voltage). In the former, the gate overdrive voltage is variable, whereas in the latter it is constant (signal independent). The result is lower and more linear switch impedance, thus enabling the sampling of an analog signal with greater precision.

High-speed pipeline analog-to-digital converters (ADC's) make use of bootstrapping techniques. Pipeline analog-to-digital converters (ADCs) are sub-ranging data converters in which a signal is quantized coarsely in several steps and the results of the different steps are then combined to achieve a high level of quantization accuracy.

Referring to FIG. 1A, a typical pipeline ADC 10 includes a plurality of stages 12, 14, . . . , L. In the first stage 12, the input $V_{in}$ is converted using a flash ADC (not shown) and is combined with results from the subsequent stages 14, 16, . . . , L to form an output. The error in each stage is determined by converting the output of that stage using a digital-to-analog converter. The difference between the input to the stage and the error is the "residue." The residue for each stage is amplified and fed to the next stage and converted in the same fashion in the next stage. The output of the last stage L is provided to a backend ADC 16 which resolves the last bits. All outputs may be provided for time alignment and digital error correction 20.

As shown in FIG. 1B, a typical stage in a pipeline ADC comprises an input signal sampling network 103a, a coarse flash ADC 102 with its own sampling network 103b, a DAC 104, and an amplifier 106. The sampling network and flash ADC 102 sample a first input signal 108 with switches 101a, 101b at the same time. The ADC 102 provides a digital version of the signal to the DAC 104. The DAC 104 converts the digital version of the signal back into analog form, providing a second signal which is subtracted 110 from the first input signal 108. The result is the "residue" and is amplified in order to occupy, typically and in the absence of errors, a portion of the range of the following stage, for example half. Ideally, the residue consists only of quantization noise.

If the sampling network 103a and flash ADC 102 do not sample the same value of the first input signal 108, the residue contains a signal-dependent component instead of quantization error only. This error term varies (increases) with the input signal frequency and, since it occupies part of the amplifier output range, it can lead to premature overload of the ADC 102.

Accordingly, it is desirable to match the main sampling network to that within the flash ADC. By "matching" it is meant not only matching the sampling time instants but also matching the time constants. To achieve the best possible matching, the two networks should be nearly identical or one a linearly scaled version of the other (including parasitics) and the switches 101a, 101b driven identically. Sampling time should be maximized to eliminate residual transient effects from the action of closing the switch, providing more accurate tracking of the input signal 108. This may be more important when the ADC 102 clock rate exceeds 300 MHz.

FIG. 2A and FIG. 2B indicate exemplary embodiments of a prior art bootstrapping technique whereby the switch gate-source voltage is constant. In the technique of FIG. 2A (referred to as "lumped" bootstrapping), a single bootstrapping circuit 202 drives the switches 101a, 101b in the input and flash ADC sampling networks 103a, 103b. The circuit further includes capacitors C1, C2 and switches 204a-204d and switches 206a, 206b. The switches are driven by periodic clocks denoted phase 1, phase 2. When phase 1 is true, phase 2 is false and vice versa. When phase 1 is true, the capacitors C1, C2 are charged to the voltage Vin. When phase 2 is true, the capacitors are connected to the sampling networks.

In the technique of FIG. 2B (referred to as "distributed" bootstrapping), each switch 101a, 101b is provided with its own bootstrapping circuit 202a, 202b, respectively. The circuit also includes capacitors C3, C4 and switches 208a-208d and switches 210a, 210b. In general, the circuit functions to charge the capacitors C3, C4 similarly to that of FIG. 2A.

Bootstrapping circuits typically employ thick oxide devices in specific locations to handle large (above supply) voltages without experiencing break down. Such devices require physical dimensions much larger than the minimum dimensions practiced for low voltage devices. Thick oxide devices may also have higher threshold voltage and lower transconductance values. For these reasons, thick oxide devices behave poorly both as active devices and as switches. When used in bootstrapping circuits, they function as switches.

SUMMARY OF THE INVENTION

These and other drawbacks in the prior art are overcome in large part by a system and method according to embodiments of the present invention. The various embodiments disclosed herein provide many benefits, for example signal independent loading, matched sampling, and maximum sampling time. The inventive concept discloses a more efficient implementation of distributed bootstrapping. A circuit for improving the performance of a bootstrapped switch in accordance with embodiments as claimed includes a first switch for connecting electrical power to a first terminal of a capacitor; a second switch for connecting a second terminal of the capacitor to a signal to be sampled; a third switch for connecting the first terminal of the capacitor to the control gate of a sampling network input switch; a fourth switch for connecting the sampling network input switch to a substrate; and a fifth switch for connecting the second terminal of the capacitor to the substrate. An input circuit for an analog-to-digital converter (ADC) includes at least one bootstrap circuit, including at least one first switch for connecting electrical power to a first terminal of at least one capacitor; at least one second switch for connecting a second terminal of the at least one capacitor to a signal to be sampled; at least one third switch for connecting the first terminal of the at least one capacitor to the control gate of at least one sampling network input switch; at least one fourth switch for connecting the at least one sampling network input switch to a substrate; and at least one fifth switch for connecting the second terminal of the at least one capacitor to the substrate.

A method for improving the performance of a bootstrapped switch includes connecting electrical power to a first terminal of a capacitor via a first switch; connecting a second terminal of the capacitor to a signal to be sampled via a second switch; connecting the first terminal of the capacitor to the control gate of a sampling network input switch via a third switch; connecting the sampling network input switch to a substrate via a fourth switch; and connecting the second terminal of the capacitor to the substrate via a fifth switch.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

The inventive concept discloses a more efficient implementation of distributed bootstrapping. The disclosure is associated with high-speed pipeline analog-to-digital converters (ADC's), and may also be extended to other applications and ADC architectures. For example, distributed bootstrapping may be applied to algorithmic ADCs, also known as cyclic ADCs, to delta-sigma ADCs, to SAR ADCs, etc. The various embodiments disclosed herein provide the many benefits, for example signal independent loading, matched sampling, and maximum sampling time.

Figure 3:
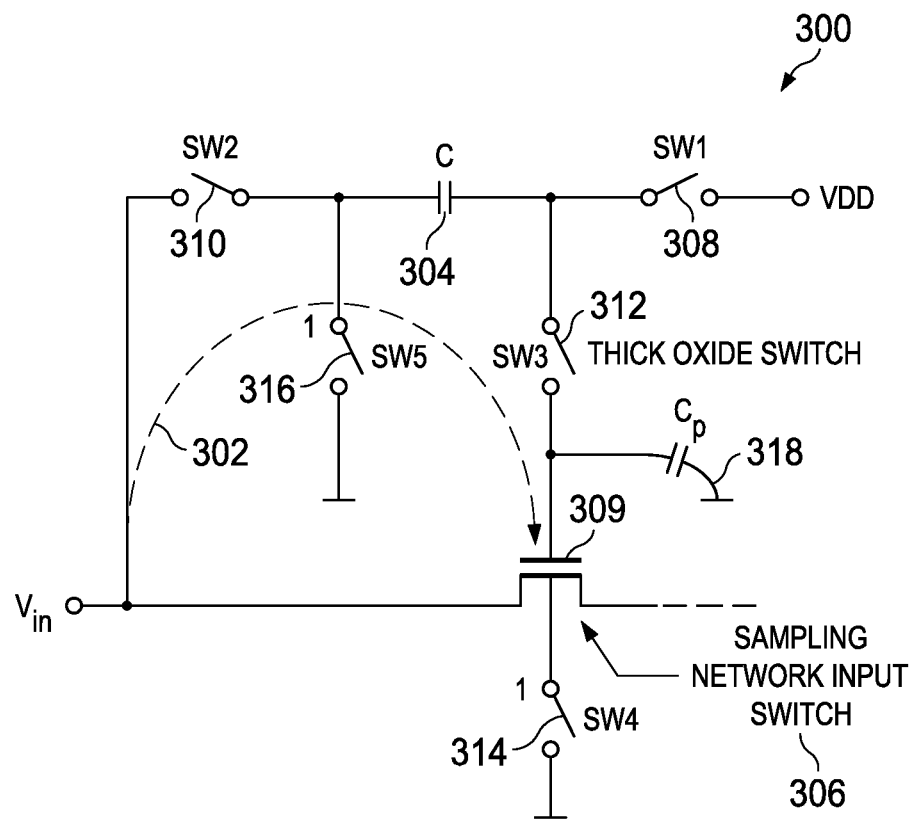
FIG. 3 illustrates an exemplary improved bootstrapping technique.

FIG. 3 is an example of a bootstrapping circuit 300 per principles of the inventive concept disclosed herein that provides a constant gate-source voltage, used with an input switch in an input sampling network. In a pipeline ADC, a similar bootstrapping circuit would be used with the flash ADC sampling network. The bootstrapping circuit 300 may be used in a lumped or distributed bootstrapping implementation.

Figure 1A:
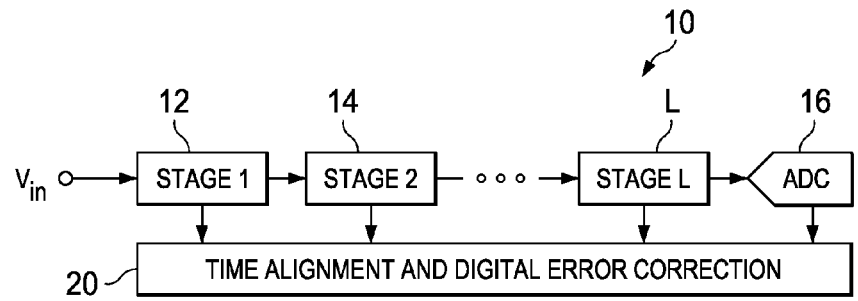
FIG. 1A illustrates an exemplary pipeline analog to digital converter (ADC).
Figure 1B:
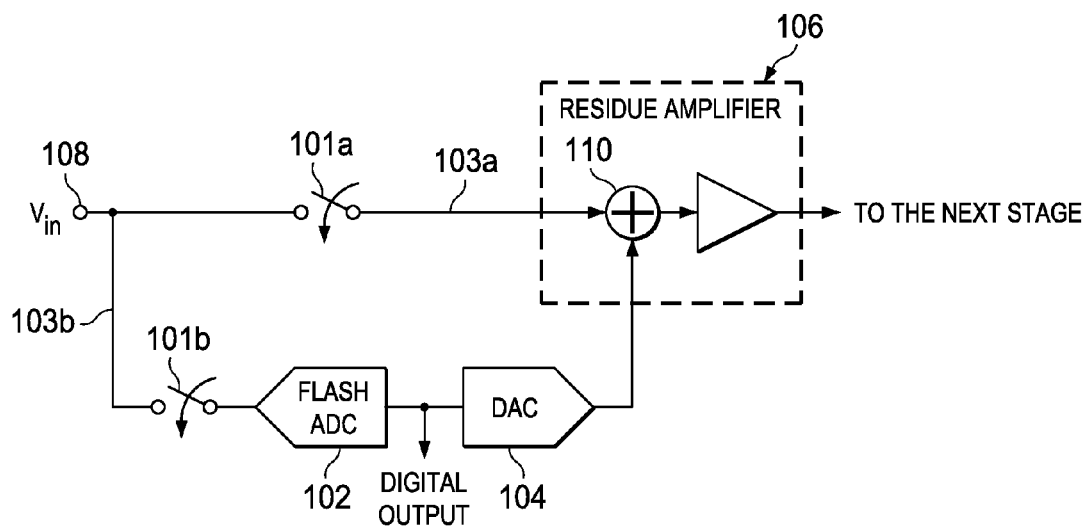
FIG. 1B illustrates an exemplary stage of a pipeline ADC.
Figure 2A:
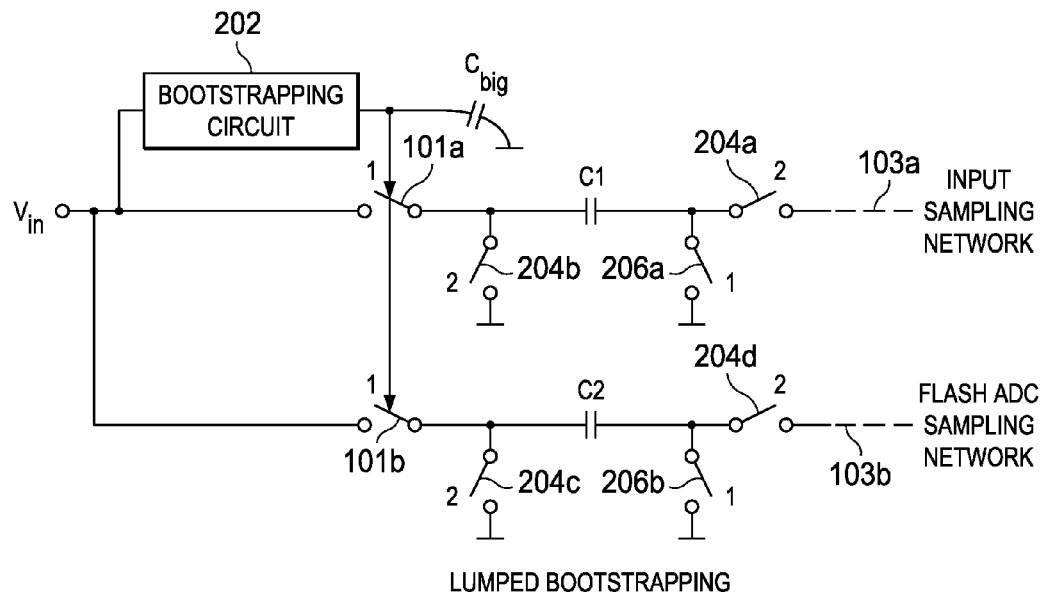
FIG. 2A and FIG. 2B illustrate exemplary bootstrapping for pipeline ADC stages.
Figure 2B:
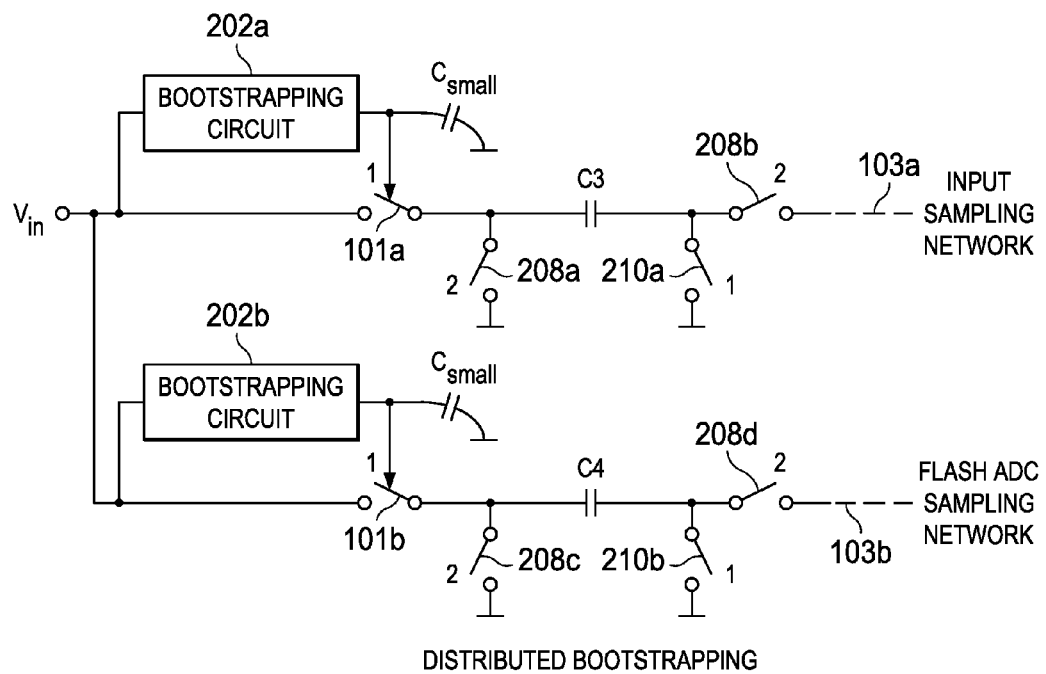

The circuit 300 includes a capacitor C, and switches SW1 308, SW2 310, SW3 312, SW4 314, and SW5 316. A MOS transistor 306 functions as the sampling network input switch (corresponding to 101a in FIG. 2A, FIG. 2B). In some embodiments, the switch SW3 312 is a thick oxide switch.

In a first phase, closing SW1 308, SW4 314, and SW5 316 pre-charges capacitor C 304 to VDD and grounds the gate 309 of the input switch 306. In a second phase, SW1 308, SW4 314, and SW5 316 are opened, then SW2 310 and SW3 312 are closed, whereby capacitor C 304 is connected between the input signal Vin and the gate 309 of the input switch 306, thereby raising the gate voltage to Vin+VDD.

In one aspect, the gate-source voltage is (Vin+VDD)−Vin=VDD, which is independent of the input signal. The extent to which this is true depends on the value of the parasitic capacitance Cp 318 (which includes the input switch intrinsic capacitance). Considering only the simplified diagram in FIG. 3, the gate voltage will settle ideally at:

$$Vg=[C/(C+Cp)](Vin+VDD). \quad [EQ 1]$$

The efficiency of the circuit may be improved by reducing the value of Cp 318, increasing the value of C 304, or in some embodiments, both. Note that in the ideal case, wherein the total gate and parasitic capacitances are zero, there is essentially no current drawn from the input when capacitor C 304 is connected to the gate.

In one aspect, wherein a lumped bootstrapping circuit is used, Cp 318 may be very large because it includes the parasitic capacitance of the trace connecting all the input switch gates in addition to the switch gate capacitances themselves. Accordingly, the value of Capacitor C 304 should increase to improve efficiency. Furthermore, since the current path 302 between the input signal and the input switch gate flows through a thick oxide switch (SW3 312), the thick oxide switch 312 should be designed to present low resistance to accelerate the rise up of voltage at the switch gate to maximize the time available for sampling. In one example, a decrease in DC ON may be accomplished by increasing the Width-length (W/L) ratio. However, this method results in additional parasitic capacitance at the terminals of the switch that effectively reduces the bootstrapping efficiency and increases the time constant. There are other fundamental limitations that prevent further fast switching of thick oxide devices. The optimization is a nonlinear problem with diminishing returns.

Therefore, it is difficult to design efficient and economic bootstrapping circuits driving very large loads at high clock rates. Because of the large capacitive load, such a circuit would exhibit large delays that become signal-dependent. For the same reason, the circuit would draw current that is signal-dependent (zero in an ideal bootstrapping circuit), causing distortion. These problems are particularly severe at clock rates near or exceeding 300 MHz.

Per principles of the disclosure, in a distributed bootstrapping approach, each switch has a dedicated bootstrapping circuit with negligible parasitic capacitive load. Capacitor C 304 and the thick oxide switch SW3 312 may be smaller and the time constants smaller as well. This provides less delay, faster switching and hence more time to sample the input signal and erase signal-dependent or transient effects. The result is better matching and more accurate sampling of the input signal. Since the parasitic capacitance Cp is significantly lower, the dynamic current consumption decreases as well.

While specific implementations and hardware/software configurations for the mobile computing device have been illustrated, it should be noted that other implementations and hardware configurations are possible and that no specific implementation or hardware/software configuration is needed. Thus, not all of the components illustrated may be needed for the mobile computing device implementing the methods disclosed herein.

As used herein, whether in the above description or the following claims, the terms "comprising," "including," "carrying," "having," "containing," "involving," and the like are to be understood to be open-ended, that is, to mean including but not limited to. Only the transitional phrases "consisting of" and "consisting essentially of," respectively, shall be considered exclusionary transitional phrases, as set forth, with respect to claims, in the United States Patent Office Manual of Patent Examining Procedures.

Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

What is claimed is:

1. A distributed bootstrap input circuit for an analog-to-digital converter (ADC), comprising:
   a first and second bootstrap circuit, the first bootstrap circuit receiving an input signal for an input sampling network and the second bootstrap circuit receiving the input signal for a flash ADC network, each including
   at least one first switch for connecting electrical power to a first terminal of at least one capacitor;
   at least one second switch for connecting a second terminal of the at least one capacitor to a signal to be sampled;
   at least one third switch for connecting the first terminal of the at least one capacitor to the control gate of at least one sampling network input switch, wherein the third switch is a thick oxide semiconductor switch;
   at least one fourth switch for connecting the at least one sampling network input switch to a substrate;
   at least one fifth switch for connecting the second terminal of the at least one capacitor to the substrate, and
   wherein each bootstrap circuit comprises a negligible parasitic capacitive load and the at least one capacitor and the at least one third switch are configured to provide for a small time constant.

2. The input circuit of claim 1, wherein the at least one first, fourth, and fifth switches switch according to a first phase, and the at least one second and third switches switch according to a second phase, the second phase opposite the first phase.

3. The input circuit of claim 1, wherein the at least one sampling network input switch is a MOS switch.

4. A method for improving the performance of a bootstrapped switch, comprising:
   Receiving an input signal by a first bootstrap circuit for an input sampling network and by a second bootstrap circuit for a flash ADC network;
   Wherein within each bootstrap circuit, the method comprises:
      connecting electrical power to a first terminal of a capacitor via a first switch;
      connecting a second terminal of the capacitor to a signal to be sampled via a second switch;
      connecting the first terminal of the capacitor to the control gate of a sampling network input switch via a third switch, wherein the third switch is a thick oxide semiconductor switch and wherein each bootstrap circuit comprises a negligible parasitic capacitive load and the capacitor and the third switch are configured to provide for a small time constant;
      connecting the sampling network input switch to a substrate via a fourth switch; and
      connecting the second terminal of the capacitor to the substrate via a fifth switch.

5. The method of claim 4, comprising connecting the first, fourth, and fifth switches switch according to a first phase, and connecting the second and third switches switch according to a second phase, the second phase opposite the first phase.

6. The method of claim 4, wherein the sampling network input switch is a MOS switch.

7. The method of claim 4, wherein the switches are clocked with a frequency exceeding 300 MHz.

8. The method of claim 4, wherein a width length ratio of the third switch is optimized with respect to the size of the at least, one capacitor.

9. The input circuit of claim 1, wherein the switches are clocked with a frequency exceeding 300 MHz.

10. The input circuit of claim 1, wherein a width length ratio of the third switch is optimized with respect to the size of the at least one capacitor.

* * * * *